United States Patent
Xiao et al.

(10) Patent No.: US 10,505,672 B2
(45) Date of Patent: Dec. 10, 2019

(54) FEC DECODING APPARATUS AND METHOD

(71) Applicant: Huawei Technologies Co., Ltd., Shenzhen (CN)

(72) Inventors: Zhiyu Xiao, Chengdu (CN); Mo Li, Chengdu (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 196 days.

(21) Appl. No.: 15/661,818

(22) Filed: Jul. 27, 2017

(65) Prior Publication Data

US 2017/0324512 A1    Nov. 9, 2017

Related U.S. Application Data

(63) Continuation of application No. PCT/CN2015/071624, filed on Jan. 27, 2015.

(51) Int. Cl.
H04L 1/00 (2006.01)
H03M 13/25 (2006.01)
H03M 13/09 (2006.01)

(52) U.S. Cl.
CPC ........ *H04L 1/0053* (2013.01); *H03M 13/096* (2013.01); *H03M 13/25* (2013.01); *H04L 1/00* (2013.01); *H04L 1/005* (2013.01); *H04L 1/0058* (2013.01); *H04L 1/0061* (2013.01); *H04L 1/0063* (2013.01)

(58) Field of Classification Search
CPC ...... H04L 1/0053; H04L 1/0051; H04L 1/005
See application file for complete search history.

(56) References Cited

U.S. PATENT DOCUMENTS

| 6,145,114 | A  | * | 11/2000 | Crozier ............... G11B 20/18 704/200 |
| 6,209,112 | B1 | * | 3/2001  | Stevenson ............ H03M 13/09 714/752 |
| 7,853,854 | B2 | * | 12/2010 | Paumier ............. H03M 13/1105 714/755 |

(Continued)

FOREIGN PATENT DOCUMENTS

| CN | 1524360 A | 8/2004 |
| CN | 1656692 A | 8/2005 |

(Continued)

OTHER PUBLICATIONS

"Series G:Transmission Systems and Media, Digital Systems and Networks; Digital sections and digital line system—Optical fibre submarine cable systems; Forward error correction for high bit-rate DWDM submarine systems" ITU-T Recommendation G.975.1, Feb. 1, 2004, XP002474600, 58 pages.

(Continued)

*Primary Examiner* — Steve N Nguyen
(74) *Attorney, Agent, or Firm* — Conley Rose, P.C.

(57) ABSTRACT

A decoding apparatus and method. When all the code words in the to-be-decoded group meet that a checksum is 0, forward error correction (FEC) decoding is not performed, and only the sign bit decision is performed. That is, in a process of performing multiple times of decoding on each code word, FEC decoding is not always performed every time. This reduces power consumption required by FEC decoding.

20 Claims, 5 Drawing Sheets

(56) References Cited

U.S. PATENT DOCUMENTS

| | | | |
|---|---|---|---|
| 8,626,820 | B1 | 1/2014 | Levy |
| 9,813,080 | B1* | 11/2017 | Micheloni ............ H03M 13/114 |
| 2003/0188248 | A1 | 10/2003 | Kauschke et al. |
| 2003/0188253 | A1 | 10/2003 | Kauschke et al. |
| 2004/0199848 | A1 | 10/2004 | Tamesue et al. |
| 2007/0067703 | A1* | 3/2007 | Berkmann ........ H03M 13/2975 |
| | | | 714/794 |
| 2008/0052594 | A1 | 2/2008 | Yedidia et al. |
| 2009/0199073 | A1* | 8/2009 | Kanaoka ............ G11B 20/1833 |
| | | | 714/758 |
| 2011/0231738 | A1 | 9/2011 | Horisaki |
| 2011/0246850 | A1 | 10/2011 | Rault et al. |

FOREIGN PATENT DOCUMENTS

| | | |
|---|---|---|
| CN | 1656693 A | 8/2005 |
| CN | 1852029 A | 10/2006 |
| CN | 1972175 A | 5/2007 |
| CN | 102082624 A | 6/2011 |
| CN | 102710385 A | 10/2012 |
| CN | 103795456 A | 5/2014 |
| CN | 103873071 A | 6/2014 |
| EP | 1643653 A1 | 4/2006 |

OTHER PUBLICATIONS

Ullah, M. A., et al., "Multi-Stage Threshold Decoding for Self-Orthogonal Convolutional Codes," XP001559532, IEICE Transactions on Fundamentals of Electronics, vol. E93-A, No. 11, Nov. 1, 2010, 10 pages.

Ullah, M. A., et al., "Multi-Stage Threshold Decoding of High Rate Convolutional Codes for Optical Communications," The Seventh Advanced International Conference on Telecommunications, AICT, Jan. 1, 2011, XP055437455, 8 pages.

Dabiri, D., "Enabling Improved DSP Based Receivers for 100G Backplane," IEEE 802.3bj Task Force, XP055437432, Sep. 1, 2011, 16 pages.

Tychopoulos, A., et al., "FEC in optical communications—a tutorial overview on the evolution of architectures and the future prospects of outband and inband FEC for optical communications," XP011165417, IEEE Circuits and Devices Magazine, vol. 22, No. 6, Nov. 1, 2006, 8 pages.

Foreign Communication From a Counterpart Application, European Application No. 15879331.5, Extended European Search Report dated Jan. 10, 2018, 10 pages.

Machine Translation and Abstract of Chinese Publication No. CN1852029, Oct. 25, 2006, 7 pages.

Foreign Communication From a Counterpart Application, PCT Application No. PCT/CN2015/071624, English Translation of International Search Report dated Sep. 24, 2015, 2 pages.

Foreign Communication From a Counterpart Application, PCT Application No. PCT/CN2015/071624, English Translation of Written Opinion dated Sep. 24, 2015, 5 pages.

Machine Translation and Abstract of Chinese Publication No. CN1972175, May 30, 2007, 12 pages.

Machine Translation and Abstract of Chinese Publication No. CN102082624, Jun. 1, 2011, 14 pages.

Machine Translation and Abstract of Chinese Publication No. CN102710385, Oct. 3, 2012, 18 pages.

Machine Translation and Abstract of Chinese Publication No. CN103795456, May 14, 2014, 28 pages.

Machine Translation and Abstract of Chinese Publication No. CN103873071, Jun. 18, 2014, 44 pages.

Foreign Communication From a Counterpart Application, Chinese Application No. 201580073971.1, Chinese Office Action dated Mar. 28, 2019, 67 pages.

* cited by examiner

FEC DECODING APPARATUS AND METHOD

CROSS-REFERENCE TO RELATED APPLICATIONS

This application is a continuation of International Patent Application No. PCT/CN2015/071624 filed on Jan. 27, 2015, which is hereby incorporated by reference in its entirety.

TECHNICAL FIELD

The present disclosure relates to the field of communications technologies, and in particular, to a forward error correction (FEC) decoding apparatus and method.

BACKGROUND

With development of communications technologies, optical fiber transmission is characterized by a large information capacity, interference immunity, a high transmission speed, or another advantage, and has become a data transmission mode dominated in current communications systems. When an optical fiber transmission system is used for data transmission, a transmit end performs FEC coding on to-be-transmitted data, performs phase modulation on a baseband signal obtained after FEC coding, and transmits data obtained after phase modulation to a transmission optical fiber so as to transmit the data to a receive end. The receive end performs coherent demodulation on the received data to restore the baseband signal, performs analog-to-digital conversion on the baseband signal to obtain a digital signal, uses a digital processing algorithm to perform dispersion compensation, clock recovery, polarization division demultiplexing, carrier phase estimation, or other processing on the digital signal to output a multi-level digital signal, obtains a likelihood ratio (LLR) of the data according to the multi-level digital signal, and performs FEC decoding on the LLR of the transmission data to obtain the data transmitted by the transmit end.

As an optical fiber transmission rate increases from 40 gigabits per second (Gb/s) to 100 Gb/s, or even up to 400 Gb/s, an amount of data that needs to be processed in FEC decoding is also increasingly high, and power consumption required by FEC decoding also constantly increases. In conventional FEC decoding, an iterative decoding mode is used. A quantity of iteration times for each code word is preset to N, and after iterative decoding is performed on each code word for N times, a decoding result of the code word is output. Generally, for most code words, after iterative decoding is performed for M times, decoding is successfully completed. The remaining N–M times of decoding does not play a role of decoding, and the redundant N–M times of iterative decoding results in a power consumption waste. M is a natural number less than N.

SUMMARY

Embodiments of the present disclosure provide an FEC decoding apparatus and method. When decoding is complete on all code words in a to-be-decoded group, FEC decoding is not performed, and only a sign bit decision is performed. This reduces power consumption required by FEC decoding.

A first aspect of the embodiments of the present disclosure provides an FEC decoding apparatus, where the apparatus includes an obtaining unit configured to obtain a to-be-decoded group, where the to-be-decoded group includes a preset quantity of code words, a first detection unit configured to detect whether all the code words in the to-be-decoded group meet that a checksum is 0, a decision unit configured to perform a sign bit decision on the to-be-decoded group when all the code words in the to-be-decoded group meet that a checksum is 0, where the sign bit decision is to decide a nonnegative number to be 1, and to decide a negative number to be 0, a second detection unit configured to detect, when all the code words in the to-be-decoded group do not meet that a checksum is 0, whether there is at least one code word on which the sign bit decision has been performed in the to-be-decoded group, a restoration unit configured to perform, when there is at least one code word on which the sign bit decision has been performed in the to-be-decoded group, data restoration on each code word on which the sign bit decision has been performed, where the data restoration is to restore 0 to a negative number of a maximum value obtained after analog-to-digital conversion, and to restore 1 to a positive number of the maximum value obtained after analog-to-digital conversion, and a first decoding unit configured to construct a new to-be-decoded group using each code word obtained after the data restoration and each code word on which the sign bit decision has not been performed, to perform FEC decoding.

In a first possible implementation of the first aspect of the embodiments of the present disclosure, the first detection unit is further configured to detect whether each code word carries a successfully decoded flag in the to-be-decoded group, and determine that all the code words in the to-be-decoded group meet that a checksum is 0 when each code word carries a successfully decoded flag in the to-be-decoded group, or determine that all the code words in the to-be-decoded group do not meet that a checksum is 0 when there is at least one code word that carries no successfully decoded flag in the to-be-decoded group, and the apparatus further includes a first checking unit configured to calculate a checksum of each code word obtained after FEC decoding in the new to-be-decoded group, and a first adding unit configured to add a successfully decoded flag to a code word whose checksum after FEC decoding is 0 in the new to-be-decoded group.

With reference to the first possible implementation of the first aspect of the embodiments of the present disclosure, in a second possible implementation, the apparatus further includes a second decoding unit configured to perform FEC decoding on the to-be-decoded group when the sign bit decision has been performed on no code word in the to-be-decoded group, a second checking unit configured to calculate a checksum of each code word obtained after FEC decoding in the to-be-decoded group, and a second adding unit configured to add a successfully decoded flag to a code word whose checksum after FEC decoding is 0 in the to-be-decoded group.

In a third possible implementation of the first aspect of the embodiments of the present disclosure, the apparatus further includes a third adding unit configured to add a decided flag to each code word in the to-be-decoded group, the second detection unit is further configured to detect whether there is at least one code word that carries a decided flag in the to-be-decoded group, and the apparatus further includes a change unit configured to change the decided flag of each code word on which the sign bit decision has been performed to an undecided flag.

With reference to any one of the first aspect to the third possible implementation of the first aspect of the embodiments of the present disclosure, in a fourth possible implementation, the apparatus further includes an output unit configured to determine whether a quantity of decoding times of a code word that is first received according to a chronological sequence in the to-be-decoded group reaches a preset quantity of decoding iteration times, and if yes, output a decoding result of the code word that is first received according to the chronological sequence.

A second aspect of the embodiments of the present disclosure provides an FEC decoding method, where the method includes obtaining a to-be-decoded group, where the to-be-decoded group includes a preset quantity of code words, detecting whether all the code words in the to-be-decoded group meet that a checksum is 0, performing a sign bit decision on the to-be-decoded group when all the code words in the to-be-decoded group meet that a checksum is 0, where the sign bit decision is to decide a nonnegative number to be 1, and to decide a negative number to be 0, detecting, when all the code words in the to-be-decoded group do not meet that a checksum is 0, whether there is at least one code word on which the sign bit decision has been performed in the to-be-decoded group, performing, when there is at least one code word on which the sign bit decision has been performed in the to-be-decoded group, data restoration on each code word on which the sign bit decision has been performed, where the data restoration is to restore 0 to a negative number of a maximum value obtained after analog-to-digital conversion, and to restore 1 to a positive number of the maximum value obtained after analog-to-digital conversion, and constructing a new to-be-decoded group using each code word obtained after the data restoration and each code word on which the sign bit decision has not been performed, to perform FEC decoding.

In a first possible implementation of the second aspect of the embodiments of the present disclosure, detecting whether all the code words in the to-be-decoded group meet that a checksum of 0 includes detecting whether each code word carries a successfully decoded flag in the to-be-decoded group, and determine that all the code words in the to-be-decoded group meet that a checksum is 0 when each code word carries a successfully decoded flag in the to-be-decoded group, or determine that all the code words in the to-be-decoded group do not meet that a checksum is 0 when there is at least one code word that carries no successfully decoded flag in the to-be-decoded group, and after constructing a new to-be-decoded group using each code word obtained after the data restoration and each code word on which the sign bit decision has not been performed to perform FEC decoding, the method further includes calculating a checksum of each code word obtained after FEC decoding in the new to-be-decoded group, and adding a successfully decoded flag to a code word whose checksum after FEC decoding is 0 in the new to-be-decoded group.

With reference to the first possible implementation of the second aspect of the embodiments of the present disclosure, in a second possible implementation, the method further includes performing FEC decoding on the to-be-decoded group when the sign bit decision has been performed on no code word in the to-be-decoded group, calculating a checksum of each code word obtained after FEC decoding in the new to-be-decoded group, and adding a successfully decoded flag to a code word whose checksum after FEC decoding is 0 in the to-be-decoded group.

In a third possible implementation of the second aspect of the embodiments of the present disclosure, after performing a sign bit decision on the to-be-decoded group, the method further includes adding a decided flag to each code word in the to-be-decoded group, detecting whether there is at least one code word on which the sign bit decision has been performed in the to-be-decoded group includes detecting whether there is at least one code word that carries a decided flag in the to-be-decoded group, and after performing data restoration on each code word on which the sign bit decision has been performed, the method further includes changing the decided flag of each code word on which the sign bit decision has been performed to an undecided flag.

With reference to any one of the second aspect to the third possible implementation of the second aspect of the embodiments of the present disclosure, in a fourth possible implementation, the method further includes determining whether a quantity of decoding times of a code word that is first received according to a chronological sequence in the to-be-decoded group reaches a preset quantity of decoding iteration times, and if yes, outputting a decoding result of the code word that is first received according to the chronological sequence.

It can be learnt from the foregoing technical solutions that the embodiments of the present disclosure have the following beneficial effects.

The embodiments of the present disclosure provide a decoding apparatus and method. The method includes obtaining a to-be-decoded group, detecting whether all code words in the to-be-decoded group meet that a checksum is 0, performing a sign bit decision on the to-be-decoded group when all the code words in the to-be-decoded group meet that a checksum is 0, detecting, when all the code words in the to-be-decoded group do not meet that a checksum is 0, whether the sign bit decision has been performed on each code word in the to-be-decoded group, performing, when there is at least one code word on which the sign bit decision has been performed in the to-be-decoded group, data restoration on each code word on which the sign bit decision has been performed, and constructing a new to-be-decoded group using each code word obtained after the data restoration and each code word on which the sign bit decision has not been performed, to perform FEC decoding. When all the code words in the to-be-decoded group meet that a checksum is 0, FEC decoding is not performed, and only the sign bit decision is performed. That is, in a process of performing multiple times of decoding on each code word, FEC decoding is not always performed every time. This reduces power consumption required by FEC decoding.

DESCRIPTION OF EMBODIMENTS

To make the purpose, technical solutions, and advantages of the embodiments of the present disclosure clearer, the following clearly describes the technical solutions of the embodiments of the present disclosure with reference to the accompanying drawings in the embodiments of the present disclosure.

Figure 1:
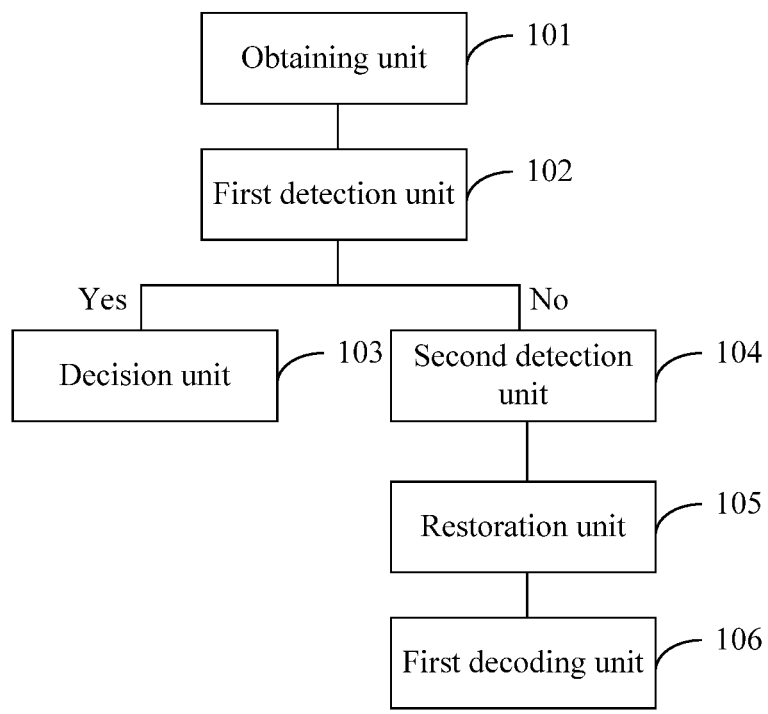
FIG. 1 is a schematic structural diagram of an FEC decoding apparatus according to an embodiment of the present disclosure.

FIG. 1 is a schematic structural diagram of an FEC decoding apparatus according to an embodiment of the present disclosure. The apparatus includes an obtaining unit 101, a first detection unit 102, a decision unit 103, a second detection unit 104, a restoration unit 105, and a first decoding unit 106.

The obtaining unit 101 is configured to obtain a to-be-decoded group. The to-be-decoded group includes a preset quantity of code words.

A transmit end divides to-be transmitted data into K code words, and sends the K code words obtained after encoding to a receive end, where each code word includes transmission data of a preset length. The receive end also divides the received transmission data into K to-be-decoded code words when decoding the received transmission data, where each to-be-decoded code word also includes transmission data of a preset length, and K is an integer greater than 0.

For each decoding, a to-be-decoded group is constructed using a preset quantity of to-be-decoded code words, and all the code words in the to-be-decoded group are arranged according to a sequence in which the code words are received. During arrangement, a code word first received is ahead of a code word later received. Herein, it should be noted that, a preset quantity of code words included in each to-be-decoded group may be set according to an actual requirement, and a preset length of transmission data included in each code word may also be set according to an actual requirement. No specific limitation is imposed herein.

For example, the transmit end divides 10000-bit transmission data into 500 code words in encoding, and each code word includes 20-bit transmission data. 19 bits are known data information bits, and 1 bit is a data coding check bit. The receive end also divides the received transmission data into 500 code words, and each code word includes 20-bit transmission data.

For each to-be-decoded code word of the preset quantity of to-be-decoded code words included in the to-be-decoded group, if FEC decoding has been performed on the to-be-decoded code word, the to-be-decoded code word is a decoding result obtained after FEC decoding is performed on the to-be-decoded code word last time. For example, FEC decoding is first performed on a to-be-decoded group abcd, and FEC decoding is then performed on a to-be-decoded group efgh. When decoding is performed on a to-be-decoded group cdef, obtained code words cd are cd obtained after FEC decoding on abcd, and obtained ef are ef obtained after FEC decoding on efgh. All a, b, c, d, e, f, g, and h are to-be-decoded code words.

The first detection unit 102 is configured to detect whether all the code words in the to-be-decoded group meet that a checksum is 0, and if yes, trigger the decision unit 103, and if no, trigger the second detection unit 104.

The transmit end sets a check relationship for a code word when encoding the transmission data. In general, the set check relationship for a code word is that a checksum of all data information in the code word is 0. At the receive end, when a code word meets that a checksum is 0, it indicates that the code word is decoded successfully, and when one code word does not meet that a checksum is 0, it indicates that the code word is decoded unsuccessfully.

When whether all the code words in the to-be-decoded group meet that a checksum is 0 is detected, for the preset quantity of code words included in the to-be-decoded group, calculation is performed for each to-be-decoded code word to detect whether a checksum 0 is met. When all to-be-decoded code words meet that a checksum is 0, all the code words in the to-be-decoded group are decoded successfully, and when there is at least one to-be-decoded code word whose checksum is not 0, all the code words in the to-be-decoded group are not decoded successfully.

The decision unit 103 is configured to perform a sign bit decision on the to-be-decoded group. The sign bit decision is to decide a nonnegative number to be 1, and to decide a negative number to be 0.

FEC decoding is performed on the to-be-decoded group only when all the code words in the to-be-decoded group meet that a checksum is 0. If a decoding result does not change, FEC decoding on the to-be-decoded group does not need to be performed repeatedly, and only the sign bit decision is performed on the to-be-decoded group. Data that is greater than or equal to 0 in the to-be-decoded group is decided to be 1, that is, data that is greater than or equal to 0 in the to-be-decoded group is replaced by 1. Data that is less than 0 in the to-be-decoded group is decided to be 0, that is, data that is less than 0 is replaced by 0. A result of performing the sign bit decision on the to-be-decoded group is used as a result of performing iterative decoding on the to-be-decoded group this time.

In other approaches, FEC decoding needs to be performed in each time of decoding. In the present disclosure, if all the code words in the to-be-decoded group meet that a checksum is 0, FEC decoding is not performed, and only the sign bit decision is performed. The sign bit decision is only to obtain a sign bit of data in the to-be-decoded group, and complicated FEC decoding does not need to be performed repeatedly. This reduces power consumption required by FEC decoding.

The second detection unit 104 is configured to detect whether there is at least one code word on which a sign bit decision has been performed in the to-be-decoded group.

The restoration unit 105 is configured to perform, when there is at least one code word on which the sign bit decision has been performed in the to-be-decoded group, data restoration on each code word on which the sign bit decision has been performed. The data restoration is to restore 0 to a negative number of a maximum value obtained after analog-to-digital conversion, and to restore 1 to a positive number of the maximum value obtained after analog-to-digital conversion.

The first decoding unit 106 is configured to construct a new to-be-decoded group using each code word obtained after the data restoration and each code word on which the sign bit decision has not been performed, to perform FEC decoding.

When all the code words in the to-be-decoded group do not meet that a checksum is 0, whether there is at least one code word on which the sign bit decision has been performed in the to-be-decoded group is first detected. A decision criterion is that all data in the code word is 0 or 1 when a sign bit decision has been performed on the code word. Then, whether all data in each code word in the to-be-decoded group is 0 or 1 is detected. When all data in a code word is 0 or 1, the sign bit decision has been performed on the code word, and the sign bit decision has not been performed on the code word when a code word has data of another numerical value than 0 and 1.

When there is at least one code word on which the sign bit decision has been performed in the to-be-decoded group, the data restoration is performed on each code word on which the sign bit decision has been performed. The data restoration is to restore 0 in the code word to a negative number of a maximum value obtained after analog-to-digital conversion, and to restore 1 to a positive number of the maximum value obtained after analog-to-digital conversion. The maximum value obtained after analog-to-digital conversion depends on a parameter of an analog-to-digital converter at the receive end. For example, when a maximum value obtained after the analog-to-digital converter at the receive end performs analog-to-digital conversion is 31, the data restoration is performed on a code word on which the sign bit decision has been performed to restore 0 in the code word to −31, and to restore 1 to 31.

The data restoration is performed on each code word on which the sign bit decision has been performed in the to-be-decoded group. A new to-be-decoded group is constructed using each code word obtained after the data restoration on which the sign bit decision has been performed and each original code word on which the sign bit decision has not been performed in the to-be-decoded group. FEC decoding is performed on the new to-be-decoded group to obtain a decoding result of iterative decoding of this time.

Herein, it should be noted that, FEC decoding is directly performed on the to-be-decoded group when the sign bit decision has been performed on no code word in the to-be-decoded group.

It can be learnt from the foregoing that, this embodiment of the present disclosure may achieve the following beneficial effects.

When all the code words in the to-be-decoded group meet that a checksum is 0, FEC decoding is not performed, and only the sign bit decision is performed. That is, in a process of performing multiple times of decoding on each code word, FEC decoding is not always performed every time. This reduces power consumption required by FEC decoding.

Figure 2:
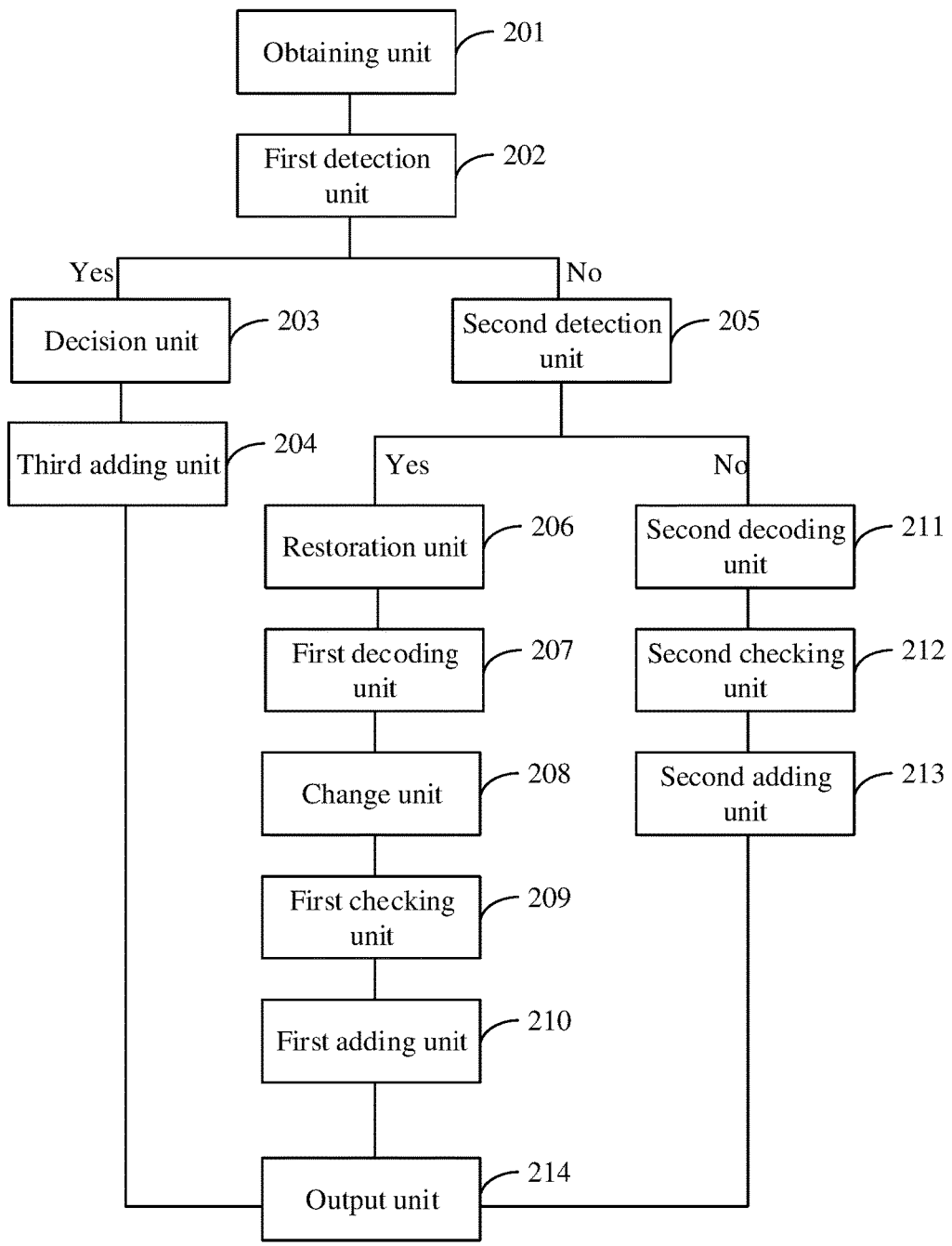
FIG. 2 is a schematic structural diagram of an FEC decoding apparatus according to an embodiment of the present disclosure.

FIG. 2 is a schematic structural diagram of an FEC decoding apparatus according to an embodiment of the present disclosure. The apparatus includes an obtaining unit 201, a first detection unit 202, a decision unit 203, a third adding unit 204, a second detection unit 205, a restoration unit 206, a first decoding unit 207, a change unit 208, a first checking unit 209, a first adding unit 210, a second decoding unit 211, a second checking unit 212, a second adding unit 213, and an output unit 214.

The obtaining unit 201 is configured to obtain a to-be-decoded group. The to-be-decoded group includes a preset quantity of code words.

The obtaining unit 201 shown in FIG. 2 is similar to the obtaining unit 101 in the FEC decoding apparatus shown in FIG. 1. Reference is made to the description of the obtaining unit 101 in the FEC decoding apparatus shown in FIG. 1, and details are not described herein again.

The first detection unit 202 is configured to detect whether each code word in the to-be-decoded group carries a successfully decoded flag, and if yes, trigger the decision unit 203, and if no, trigger the second detection unit 205.

For each to-be-decoded code word in the to-be-decoded group, a checksum of the code word is calculated after last iterative decoding of the code word is completed, and a successfully decoded flag is added to the code word when the checksum of the code word is 0. Then, whether each code word in the to-be-decoded group carries a successfully decoded flag is detected, that is, whether all the code words in the to-be-decoded group meet that a checksum is 0 is detected. When the code word is used as a code word in the to-be-decoded group again, the checksum of the code word does not need to be calculated repeatedly, and it only needs to detect whether the code word carries a successfully decoded flag.

A checksum of each code word in the to-be-decoded group is 0 when each code word in the to-be-decoded group carries a successfully decoded flag. When there is at least one code word that carries no successfully decoded flag in the to-be-decoded group, it indicates that there is at least one code word whose checksum is not 0 in the to-be-decoded group, that is, all the code words in the to-be-decoded group do not meet that a checksum is 0.

The decision unit 203 is configured to perform a sign bit decision on the to-be-decoded group. The sign bit decision is to decide a nonnegative number to be 1, and to decide a negative number to be 0.

When each code word in the to-be-decoded group carries a successfully decoded flag, it indicates that all the code words in the to-be-decoded group meet that a checksum is 0, and FEC decoding is performed on the to-be-decoded group. If a decoding result does not change, FEC decoding on the to-be-decoded group does not need to be performed repeatedly, and only the sign bit decision is performed on the to-be-decoded group. Performing the sign bit decision on the to-be-decoded group is to decide data that is greater than or equal to 0 in the to-be-decoded group to 1, that is, the data that is greater than or equal to 0 in the to-be-decoded group is replaced by 1, and to decide data that is less than 0 in the to-be-decoded group to 0, that is, the data that is less than 0 is replaced by 0. A result of performing the sign bit decision on the to-be-decoded group is used as a result of performing iterative decoding on the to-be-decoded group this time.

The third adding unit 204 is configured to add a decided flag to each code word in the to-be-decoded group.

When each code word in the to-be-decoded group carries a successfully decoded flag, the sign bit decision is performed on the to-be-decoded group. After the sign bit decision is performed, a decided flag is added to each code word in the to-be-decoded group to indicate that the sign bit decision has been performed on the code word.

When whether the sign bit decision has been performed on one code word is determined subsequently, whether all the data in the code word is 0 or 1 does not need to be checked, and whether the code word carries the decided flag needs to be detected only. This simplifies the step of detecting whether the sign bit decision has been performed on a code word.

The second detection unit 205 is configured to detect whether there is at least one code word that carries a decided flag in the to-be-decoded group, and if yes, trigger the restoration unit 206, and if no, trigger the second decoding unit 211.

The restoration unit 206 is configured to perform data restoration on each code word that carries a decided flag. The data restoration is to restore 0 to a negative number of a maximum value obtained after analog-to-digital conversion, and to restore 1 to a positive number of the maximum value obtained after analog-to-digital conversion.

When all the code words in the to-be-decoded group do not carry a successfully decoded flag, whether there is at least one code word that carries a decided flag in the to-be-decoded group is detected. When a code word carries a decided flag, it indicates that the sign bit decision has been performed on the code word, that is, all data in the code word is 0 or 1. Because FEC decoding is performed on a positive number and a negative number, the data restoration needs to be performed on a code word that carries a decided flag.

The data restoration is to restore 0 in the code word to a negative number of a maximum value obtained after analog-to-digital conversion, and to restore 1 to a positive number of the maximum value obtained after analog-to-digital conversion. The maximum value obtained after analog-to-digital conversion depends on a parameter of an analog-to-digital converter at the receive end.

The first decoding unit 207 is configured to construct a new to-be-decoded group using each code word obtained after the data restoration and each code word on which the sign bit decision has not been performed to perform FEC decoding.

A new to-be-decoded group is constructed using each code word obtained after the data restoration is performed and each code word on which sign bit decision has not been performed in the to-be-decoded group, and FEC decoding is performed on the new to-be-decoded group.

The change unit 208 is configured to change the decided flag of each code word on which the sign bit decision has been performed to an undecided flag.

The data restoration is performed on each code word on which the sign bit decision has been performed in the to-be-decoded group, data in the code word on which the sign bit decision has been performed in the to-be-decoded group may be 0, 1, or another value such that a condition of performing the sign bit decision is not satisfied. As a result, the decided flag of each code word on which the sign bit decision has been performed is changed to the undecided flag.

The first checking unit 209 is configured to calculate a checksum of each code word obtained after FEC decoding in the new to-be-decoded group.

The first adding unit 210 is configured to add a successfully decoded flag to a code word whose checksum after FEC decoding is 0 in the new to-be-decoded group.

The second decoding unit 211 is configured to perform FEC decoding on the to-be-decoded group.

A checksum of each code word obtained after FEC decoding in the new to-be-decoded group is calculated, and the successfully decoded flag is added to the code word whose checksum after FEC decoding is 0 in the new to-be-decoded group to indicate that the code word is decoded successfully. When the code word is used as a to-be-decoded code word in another to-be-decoded group, whether the code word carries a successfully decoded flag is determined so as to determine whether the checksum of the code word is 0, and the checksum of the code word does not need to be calculated repeatedly.

The second checking unit 212 is configured to calculate a checksum of each code word obtained after FEC decoding in the to-be-decoded group.

The second adding unit 213 is configured to add a successfully decoded flag to a code word whose checksum after FEC decoding is 0 in the to-be-decoded group.

When the sign bit decision has been performed on no code word in the to-be-decoded group, FEC decoding is directly performed on the to-be-decoded group. The checksum of each code word obtained after FEC decoding in the new to-be-decoded group is calculated, and the successfully decoded flag is added to the code word whose checksum after FEC decoding is 0 in the to-be-decoded group, to indicate that the code word is decoded successfully. When the code word is used as a to-be-decoded code word in another to-be-decoded group, whether the code word carries a successfully decoded flag is determined so as to determine whether the checksum of the code word is 0, and the checksum of the code word does not need to be calculated repeatedly.

The output unit 214 is configured to determine whether a quantity of decoding times of a code word that is first received according to a chronological sequence in the to-be-decoded group reaches a preset quantity of decoding iteration times, and if yes, output a decoding result of the code word that is first received according to the chronological sequence.

After iterative decoding is complete this time, a code word first received according to the chronological sequence, that is, a first code word in the to-be-decoded group, is obtained from the to-be-decoded group to determine whether the quantity of decoding times of the code word reaches the preset quantity of decoding iteration times, and if yes, a decoding result of the code word is output. The preset quantity of decoding iteration times may be set according to an actual requirement, and no specific limitation is imposed herein.

Each time of iterative decoding is actually only for decoding a code word first received according to the chronological sequence in the to-be-decoded group. When whether a quantity of decoding times of a code word that is first received according to a chronological sequence in the to-be-decoded group reaches a preset quantity of decoding iteration times, the code word first received according to the chronological sequence is definitely decoded, and the decoding result of the code word first received according to the chronological sequence may be output.

For example, after decoding on a to-be-decoded group including four code words, f, g, h, and i, is completed, the code word f first received according to a chronological sequence is obtained to determine whether a quantity of decoding times of the code word f reaches the preset quantity of decoding iteration times, and if yes, a decoding result of the code word f is output.

In each time of iterative decoding, a decoding result of a maximum of one code word is output. If a quantity of decoding times of the code word that is first received according to the chronological sequence in the to-be-decoded group does not reach the preset quantity of decoding iteration times, no decoding result is output. Herein, it should be noted that, the output decoding result described in this embodiment of the present disclosure is a decoding result output by an FEC decoder at the receive end, instead of a decoding result of a to-be-decoded group obtained after each iteration. An iterative decoding result of the to-be-decoded group is repeatedly used by the FEC decoder and is not output.

Figure 3:
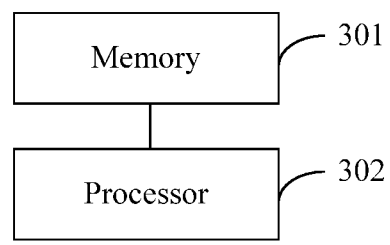
FIG. 3 is a schematic diagram of a hardware structure of an FEC decoding apparatus according to an embodiment of the present disclosure.

FIG. 3 is a schematic diagram of a hardware structure of an FEC decoding apparatus according to an embodiment of the present disclosure. The apparatus includes a memory 301, and a processor 302 connected to the memory 301, where the memory 301 is configured to store a set of program instructions, and the processor 302 is configured to invoke the program instructions stored in the memory 301 to perform the operations of obtaining a to-be-decoded group, where the to-be-decoded group includes a preset quantity of code words, detecting whether all the code words in the to-be-decoded group meet that a checksum is 0, performing a sign bit decision on the to-be-decoded group when all the code words in the to-be-decoded group meet that a checksum is 0, where the sign bit decision is to decide a non-negative number to be 1, and to decide a negative number to be 0, detecting, when all the code words in the to-be-decoded group do not meet that a checksum is 0, whether there is at least one code word on which the sign bit decision has been performed in the to-be-decoded group, performing, when there is at least one code word on which the sign bit decision has been performed in the to-be-decoded group, data restoration on each code word on which the sign bit decision has been performed, where the data restoration is to restore 0 to a negative number of a maximum value obtained after analog-to-digital conversion, and to restore 1 to a positive number of the maximum value obtained after analog-to-digital conversion, and constructing a new to-be-decoded group using each code word obtained after the data restoration and each code word on which the sign bit decision has not been performed, to perform FEC decoding.

Optionally, the instruction of detecting whether all the code words in the to-be-decoded group meet that a checksum is 0 includes detecting whether each code word in the to-be-decoded group carries a successfully decoded flag, when each code word in the to-be-decoded group carries a successfully decoded flag, all the code words in the to-be-decoded group meet that a checksum is 0, when there is at least one code word that carries no successfully decoded flag in the to-be-decoded group, all the code words in the to-be-decoded group do not meet that a checksum is 0, and after the instruction of constructing a new to-be-decoded group using each code word obtained after the data restoration and each code word on which the sign bit decision has not been performed to perform FEC decoding, the instructions further include calculating a checksum of each code word obtained after FEC decoding in the new to-be-decoded group, and adding a successfully decoded flag to a code word whose checksum after FEC decoding is 0 in the new to-be-decoded group.

Optionally, the instructions further include performing FEC decoding on the to-be-decoded group when the sign bit decision has been performed on no code word in the to-be-decoded group, calculating a checksum of each code word obtained after FEC decoding in the new to-be-decoded group, and adding a successfully decoded flag to a code word whose checksum after FEC decoding is 0 in the to-be-decoded group.

Optionally, after the instruction of performing a sign bit decision on the to-be-decoded group, the instructions further include adding a decided flag to each code word in the to-be-decoded group. The instruction of detecting whether there is at least one code word on which the sign bit decision has been performed in the to-be-decoded group includes detecting whether there is at least one code word that carries a decided flag in the to-be-decoded group, and after the instruction of performing data restoration on each code word on which the sign bit decision has been performed, the instructions further include changing the decided flag of each code word on which the sign bit decision has been performed to an undecided flag.

Optionally, the instructions further include determining whether a quantity of decoding times of a code word that is first received according to a chronological sequence in the to-be-decoded group reaches a preset quantity of decoding iteration times, and if yes, outputting a decoding result of the code word that is first received according to the chronological sequence.

The processor 302 may be a central processing unit (CPU), and the memory 301 may be an internal memory, such as a random access memory (RAM). The memory 301 and the processor 302 may be integrated as one or more independent circuits or hardware, such as an application specific integrated circuit (ASIC).

In the hardware implementation structure of the FEC decoding apparatus shown in FIG. 3, a technical implementation process of the operations performed by the processor 302 is similar to the technical implementation process of the FEC decoding apparatus shown in FIG. 1 and FIG. 2. Reference is made to the descriptions of the FEC apparatus shown FIG. 1 and FIG. 2, and details are not described herein again.

Figure 4:
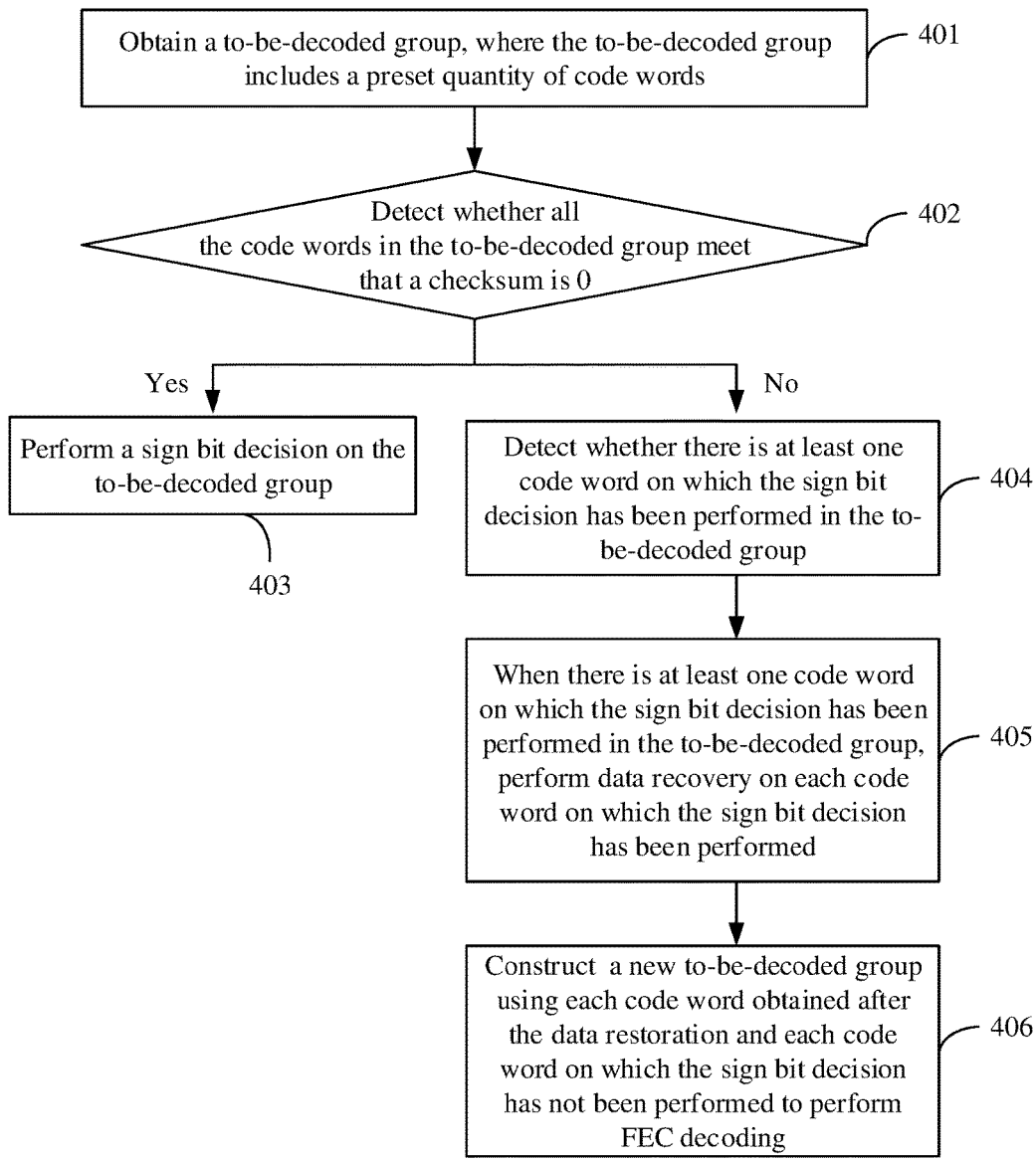
FIG. 4 is a flowchart of an FEC decoding method according to an embodiment of the present disclosure.

FIG. 4 is a flowchart of an FEC decoding method according to an embodiment of the present disclosure. The method includes the following steps.

Step 401: Obtain a to-be-decoded group, where the to-be-decoded group includes a preset quantity of code words.

Step 402: Detect whether all the code words in the to-be-decoded group meet that a checksum is 0, and if yes, perform 403, and if no, perform 404.

Step 403: Perform a sign bit decision on the to-be-decoded group, where the sign bit decision is to decide a nonnegative number to be 1, and to decide a negative number to be 0.

FEC decoding is performed on the to-be-decoded group only when all the code words in the to-be-decoded group meet that a checksum is 0. If a decoding result does not change, FEC decoding on the to-be-decoded group does not need to be performed repeatedly, and only the sign bit decision is performed on the to-be-decoded group. Data that is greater than or equal to 0 in the to-be-decoded group is decided to be 1, that is, data that is greater than or equal to 0 in the to-be-decoded group is replaced by 1. Data that is less than 0 in the to-be-decoded group is decided to be 0, that is, data that is less than 0 is replaced by 0. A result of performing the sign bit decision on the to-be-decoded group is used as a result of performing iterative decoding on the to-be-decoded group this time.

In other approaches, FEC decoding needs to be performed in each time of decoding. In the present disclosure, if all the code words in the to-be-decoded group meet that a checksum is 0, FEC decoding is not performed, and only the sign bit decision is performed. The sign bit decision is only to obtain a sign bit of data in the to-be-decoded group, and complicated FEC decoding does not need to be performed repeatedly. This reduces power consumption required by FEC decoding.

Step 404: Detect whether there is at least one code word on which the sign bit decision has been performed in the to-be-decoded group.

Step 405: When there is at least one code word on which the sign bit decision has been performed in the to-be-decoded group, perform data restoration on each code word on which the sign bit decision has been performed, where the data restoration is to restore 0 to a negative number of a maximum value obtained after analog-to-digital conversion, and to restore 1 to a positive number of the maximum value obtained after analog-to-digital conversion.

Step 406: Construct a new to-be-decoded group using each code word obtained after the data restoration and each code word on which the sign bit decision has not been performed to perform FEC decoding.

The FEC decoding method described in FIG. 4 is a method corresponding to the FEC decoding apparatus shown in FIG. 1, and a technical implementation process is similar to that described in FIG. 1. Reference is made to the description of the technical implementation process of the FEC apparatus shown in FIG. 1, and details are not described herein again.

Figure 5:
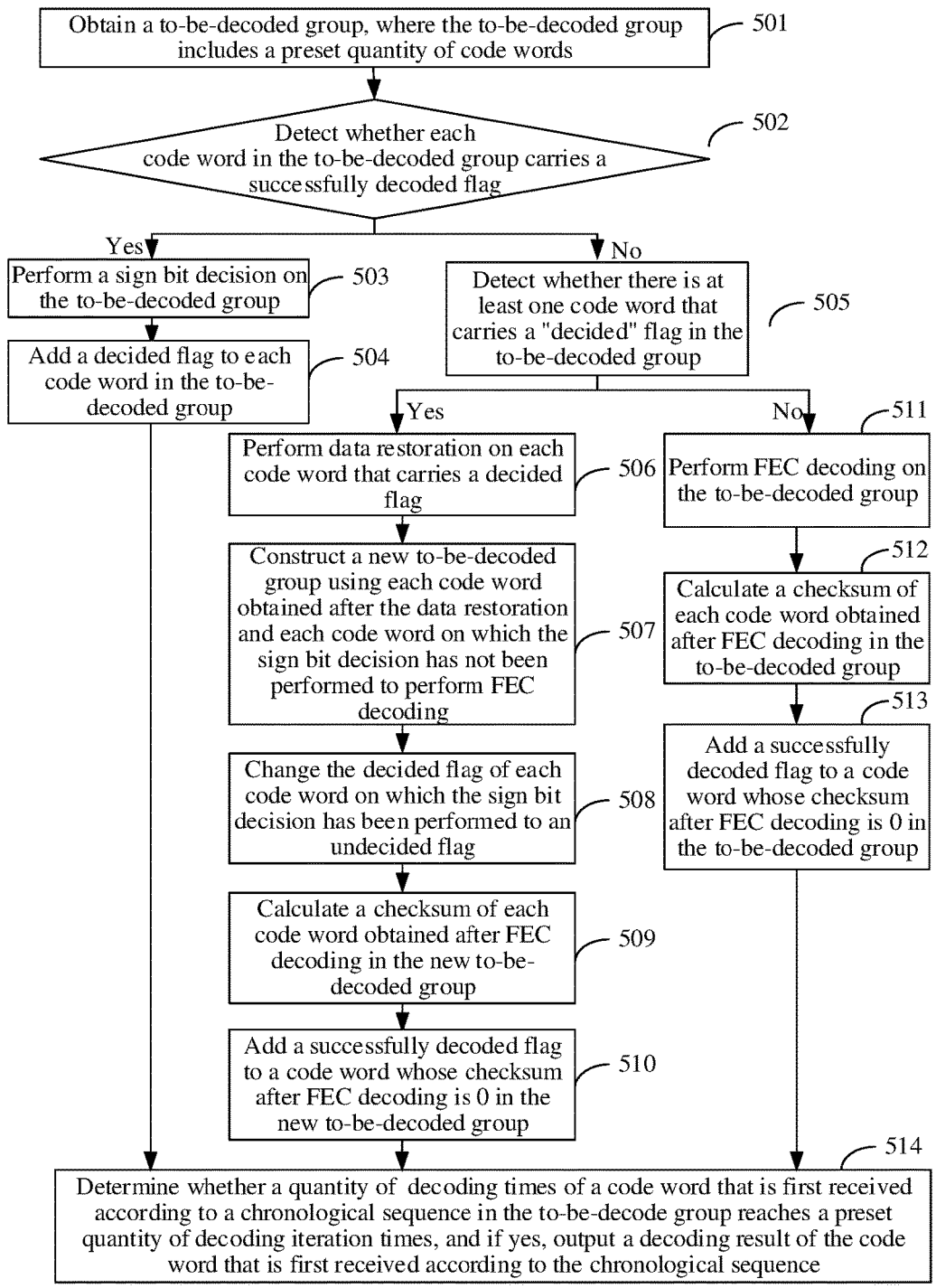
FIG. 5 is a flowchart of an FEC decoding method according to an embodiment of the present disclosure.

FIG. 5 is a flowchart of an FEC decoding method according to an embodiment of the present disclosure. The method includes the following steps.

Step 501: Obtain a to-be-decoded group, where the to-be-decoded group includes a preset quantity of code words.

Step 502: Detect whether each code word in the to-be-decoded group carries a successfully decoded flag, and if yes, perform 503, and if no, perform 505.

Step 503: Perform a sign bit decision on the to-be-decoded group, where the sign bit decision is to decide a nonnegative number to be 1, and to decide a negative number to be 0.

Step 504: Add a decided flag to each code word in the to-be-decoded group.

Step 505: Detect whether there is at least one code word that carries a decided flag in the to-be-decoded group, and if yes, perform 506, and if no, perform 511.

Step 506: Perform data restoration on each code word that carries a decided flag, where the data restoration is to restore 0 to a negative number of a maximum value obtained after analog-to-digital conversion, and to restore 1 to a positive number of the maximum value obtained after analog-to-digital conversion.

Step 507: Construct a new to-be-decoded group using each code word obtained after the data restoration and each code word on which the sign bit decision has not been performed to perform FEC decoding.

Step 508: Change the decided flag of each code word on which the sign bit decision has been performed to an undecided flag.

Step 509: Calculate a checksum of each code word obtained after FEC decoding in the new to-be-decoded group.

Step 510: Add a successfully decoded flag to a code word whose checksum after FEC decoding is 0 in the new to-be-decoded group.

Step 511: Perform FEC decoding on the to-be-decoded group.

Step 512: Calculate a checksum of each code word obtained after FEC decoding in the to-be-decoded group.

Step 513: Add a successfully decoded flag to a code word whose checksum after FEC decoding is 0 in the to-be-decoded group.

Step 514: Determine whether a quantity of decoding times of a code word that is first received according to a chronological sequence in the to-be-decoded group reaches a preset quantity of decoding iteration times, and if yes, output a decoding result of the code word that is first received according to the chronological sequence.

The FEC decoding method described in FIG. 5 is a method corresponding to the FEC decoding apparatus shown in FIG. 2, and a technical implementation process is similar to that described in FIG. 2. Reference is made to the description of the technical implementation process of the FEC apparatus shown in FIG. 2, and details are not described herein again.

A person of ordinary skill in the art may understand that all or a part of the steps of the method in the embodiments of the present disclosure may be implemented by a program instructing relevant hardware. The program may be stored in a computer readable storage medium. When the program runs, the steps of the method in the embodiments of the present disclosure are performed. The storage medium may be at least one of media that are capable of storing program code, such as a read-only memory (ROM), a RAM, a magnetic disk, or an optical disc.

The foregoing descriptions are merely examples of embodiments of the present disclosure, but are not intended to limit the protection scope of the present disclosure. It should be noted that a person of ordinary skill in the art may make certain improvements and polishing without departing from the principle of the present application and the improvements and polishing shall fall within the protection scope of the present application.

What is claimed is:

1. A forward error correction (FEC) decoding apparatus, comprising:
   a memory comprising instructions; and
   a processor coupled to the memory, wherein the instructions cause the processor to be configured to:
      obtain a to-be-decoded group comprising a preset quantity of code words;
      detect whether a checksum for all the code words in the to-be-decoded group is 0;
      perform, when the checksum for all the code words in the to-be-decoded group is 0, a sign bit decision on the to-be-decoded group to assign a nonnegative number to be 1 and to assign a negative number to be 0;
      detect whether there is at least one code word in the to-be-decoded group on which the sign bit decision has been performed when the checksum for at least one of the code words in the to-be-decoded group is not 0;
      perform data restoration on the at least one code word on which the sign bit decision has been performed when the to-be-decoded group includes the at least one code word on which the sign bit decision has been performed and when the checksum for at least one of the code words in the to-be-decoded group is not 0, wherein performance of the data restoration comprises restoring 0 values to a negative number corresponding to a maximum value obtained after analog-to-digital conversion, and restoring 1 values to a positive number corresponding to the maximum value obtained after the analog-to-digital conversion; and
      construct a new to-be-decoded group using each code word obtained after the data restoration and each code word on which the sign bit decision has not been performed to perform FEC decoding.

2. The apparatus of claim 1, wherein the instructions further cause the processor to be configured to:
   detect whether each code word in the to-be-decoded group carries a successfully decoded flag;
   determine that the checksum for all the code words in the to-be-decoded group is 0 when each code word carries the successfully decoded flag;
   determine that the checksum for all the code words in the to-be-decoded group is not 0 when there is at least one code word that does not carry the successfully decoded flag;
   calculate a checksum of each code word in the new to-be-decoded group that is obtained after the FEC decoding; and
   add the successfully decoded flag to each code word in the new to-be-decoded group, whose checksum after the FEC decoding is 0.

3. The apparatus of claim 1, wherein the instructions further cause the processor to be configured to:
   perform the FEC decoding on the to-be-decoded group when the sign bit decision has not been performed on any code word in the to-be-decoded group;
   calculate a checksum of each code word in the new to-be-decoded group that is obtained after the FEC decoding; and
   add a successfully decoded flag to each code word in the new to-be-decoded group whose checksum after the FEC decoding is 0.

4. The apparatus of claim 1, wherein each code word in the to-be-decoded group on which the sign bit decision has been performed carries a decided flag, wherein the instructions that are configured to cause the processor to detect whether there is the at least one code word in the to-be-decoded group on which the sign bit decision has been performed when the checksum for at least one of the code words in the to-be-decoded group is not 0 are configured to cause the processor to detect whether there is at least one code word in the to-be-decoded group that carries the decided flag, and wherein the instructions are further configured to cause the processor to change the decided flag of each of the at least one code word in the to-be-decoded group that carries the decided flag to an undecided flag.

5. The apparatus of claim 4, wherein the instructions further cause the processor to be configured to:
determine whether a quantity of decoding times of a code word first received according to a chronological sequence in the to-be-decoded group reaches a preset quantity of decoding iteration times; and
output a decoding result of the code word first received according to the chronological sequence when the quantity of decoding times of the code word reaches the preset quantity of decoding iteration times.

6. The apparatus of claim 1, wherein the instructions further cause the processor to be configured to add a decided flag to each code word in the to-be-decoded group when the processor performs the sign bit decision on the to-be-decoded group.

7. The apparatus of claim 1, wherein the to-be-decoded group on which the sign bit decision is performed is a first to-be-decoded group, and wherein the to-be-decoded group on which the data restoration is performed is a second to-be-decoded group that includes at least one code word of the first to-be-decoded group.

8. A forward error correction (FEC) decoding method, comprising:
obtaining a to-be-decoded group comprising a preset quantity of code words;
detecting whether a checksum for all the code words in the to-be-decoded group is 0;
performing, when the checksum for all the code words in the to-be-decoded group is 0, a sign bit decision on the to-be-decoded group to assign a nonnegative number to be 1 and to assign a negative number to be 0;
detecting whether there is at least one code word in the to-be-decoded group on which the sign bit decision has been performed when the checksum for all the code words in the to-be-decoded group is not 0;
performing data restoration on the at least one code word on which the sign bit decision has been performed when the to-be-decoded group includes the at least one code word on which the sign bit decision has been performed and when the checksum for at least one of the code words in the to-be-decoded group is not 0, wherein performing the data restoration restores a 0 value to a negative number corresponding to a maximum value obtained after analog-to-digital conversion, and restores a 1 value to a positive number corresponding to the maximum value obtained after the analog-to-digital conversion; and
constructing a new to-be-decoded group using each code word obtained after performing the data restoration and each code word on which the sign bit decision has not been performed to perform FEC decoding.

9. The method of claim 8, wherein detecting whether the checksum for all the code words in the to-be-decoded group is 0 comprises:
detecting whether each code word in the to-be-decoded group carries a successfully decoded flag;
determine that the checksum for all the code words in the to-be-decoded group is 0 when each code word in the to-be-decoded group carries the successfully decoded flag; and
determine that the checksum for all the code words in the to-be-decoded group is not 0 when at least one code word in the to-be-decoded group does not carry the successfully decoded flag,
wherein the method further comprises performing the FEC decoding at least in part by, after constructing the new to-be-decoded group using each code word obtained after the data restoration and each code word on which the sign bit decision has not been performed:
calculating a checksum of each code word in the new to-be-decoded group that is obtained after the FEC decoding; and
adding the successfully decoded flag to each code word in the new to-be-decoded group whose checksum after the FEC decoding is 0.

10. The method of claim 8, further comprising:
performing the FEC decoding on the to-be-decoded group when the sign bit decision has not been performed on any code word in the to-be-decoded group;
calculating a checksum of each code word in the new to-be-decoded group obtained after the FEC decoding; and
adding a successfully decoded flag to each code word in the new to-be-decoded group whose checksum after the FEC decoding is 0.

11. The method of claim 8, wherein each code word in the to-be-decoded group on which sign bit decision has been performed carries a decided flag, wherein detecting whether there is the at least one code word on which the sign bit decision has been performed in the to-be-decoded group comprises detecting whether there is at least one code word in the to-be-decoded group that carries the decided flag, and wherein after performing the data restoration on each code word on which the sign bit decision has been performed, the method further comprises changing the decided flag of each code word in the to-be-decoded group on which the sign bit decision has been performed to an undecided flag.

12. The method of claim 11, further comprising:
determining whether a quantity of decoding times of a code word in the to-be-decoded group that is first received according to a chronological sequence reaches a preset quantity of decoding iteration times; and
outputting a decoding result of the code word first received according to the chronological sequence when the quantity of decoding times of the code word reaches the preset quantity of decoding iteration times.

13. The method of claim 8, further comprising adding a decided flag to each code word in the to-be-decoded group when the sign bit decision on the to-be-decoded group is performed.

14. The method of claim 8, wherein the to-be-decoded group on which the sign bit decision is performed is a first to-be-decoded group, and wherein the to-be-decoded group on which the data restoration is performed is a second to-be-decoded group that includes at least one code word of the first to-be-decoded group.

15. A computer program product comprising a non-transitory computer readable storage medium storing program code thereon for forward error correction (FEC) decoding, wherein the program code, when executed by a processor, is configured to cause the processor to:

obtain a to-be-decoded group comprising a preset quantity of code words;

detect whether a checksum for all the code words in the to-be-decoded group is 0;

perform, when the checksum for all the code words in the to-be-decoded group is 0, a sign bit decision on the to-be-decoded group to assign a nonnegative number to be 1 and to assign a negative number to be 0;

detect whether there is at least one code word in the to-be-decoded group on which the sign bit decision has been performed when the checksum for all the code words in the to-be-decoded group is not 0;

perform data restoration on the at least one code word on which the sign bit decision has been performed when the to-be-decoded group includes the at least one code word on which the sign bit decision has been performed and when the checksum for at least one of the code words in the to-be-decoded group is not 0, wherein the performance of the data restoration restores a 0 value to a negative number corresponding to a maximum value obtained after analog-to-digital conversion, and restores a 1 value to a positive number corresponding to the maximum value obtained after the analog-to-digital conversion; and construct a new to-be-decoded group using each code word obtained after the data restoration and each code word on which the sign bit decision has not been performed to perform FEC decoding.

16. The computer program product of claim 15, wherein the program code that causes the processor to detect whether the checksum for all the code words in the to-be-decoded group is 0 causes the processor to:

detect whether each code word in the to-be-decoded group carries a successfully decoded flag;

determine that the checksum for all the code words in the to-be-decoded group is 0 when each code word in the to-be-decoded group carries the successfully decoded flag; and determine that the checksum for all the code words in the to-be-decoded group is not 0 when there is at least one code word in the to-be-decoded group that does not carry the successfully decoded flag, and wherein the program code is further configured to cause the processor to, after constructing the new to-be-decoded group:

calculate a checksum of each code word in the new to-be-decoded group that obtained after the FEC decoding; and add the successfully decoded flag to each code word in the new to-be-decoded group whose checksum after the FEC decoding is 0.

17. The computer program product of claim 15, wherein the program code is further configured to cause the processor to:

perform the FEC decoding on the to-be-decoded group when the sign bit decision has not been performed on any code word in the to-be-decoded group;

calculate a checksum of each code word in the new to-be-decoded group that is obtained after the FEC decoding; and add a successfully decoded flag to each code word in the new to-be-decoded group whose checksum after the FEC decoding is 0.

18. The computer program product of claim 15, wherein each of the code words in the to-be-decoded group on which sign bit decision has been performed carries a decided flag, wherein the program code that causes the processor to detect whether there is the at least one code word in the to-be-decoded group on which the sign bit decision has been performed is configured to cause the processor to detect whether at least one code word in the to-be-decoded group carries the decided flag, and wherein the program code is configured to cause the processor to, after performing the data restoration on each code word on which the sign bit decision has been performed, change the decided flag of each code word in the to-be-decoded group on which the sign bit decision has been performed to an undecided flag.

19. The computer program product of claim 18, wherein the program code is further configured to cause the processor to:

determine whether a quantity of decoding times of a code word in the to-be-decoded group that is first received according to a chronological sequence in the to-be-decoded group reaches a preset quantity of decoding iteration times; and output a decoding result of the code word first received according to the chronological sequence when the quantity of decoding times of the code word reaches the preset quantity of decoding iteration times.

20. The computer program product of claim 15, wherein the program code is further configured to cause the processor to add a decided flag to each code word in the to-be-decoded group when the processor performs the sign bit decision on the to-be-decoded group.

* * * * *